(12) United States Patent
Verhoeve et al.

(10) Patent No.: US 10,506,713 B2
(45) Date of Patent: *Dec. 10, 2019

(54) RECEPTACLE FOR CONNECTING TO FLEXIBLE CIRCUIT BOARD

(71) Applicant: Apple Inc., Cupertino, CA (US)

(72) Inventors: Dustin J. Verhoeve, San Francisco, CA (US); Jason C. Sauers, Cupertino, CA (US); Benjamin J. Kallman, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/101,962

(22) Filed: Aug. 13, 2018

(65) Prior Publication Data

US 2019/0110362 A1    Apr. 11, 2019

Related U.S. Application Data

(63) Continuation of application No. 15/888,545, filed on Feb. 5, 2018, now Pat. No. 10,051,732, which is a continuation of application No. 14/641,316, filed on Mar. 7, 2015, now Pat. No. 9,888,571.

(60) Provisional application No. 62/044,869, filed on Sep. 2, 2014.

(51) Int. Cl.
| | |
|---|---|
| *H01R 12/00* | (2006.01) |
| *H05K 1/09* | (2006.01) |
| *H01R 12/70* | (2011.01) |
| *H01R 13/52* | (2006.01) |
| *H01R 12/61* | (2011.01) |
| *H01R 13/74* | (2006.01) |

(52) U.S. Cl.
CPC ............... *H05K 1/09* (2013.01); *H01R 12/61* (2013.01); *H01R 12/7082* (2013.01); *H01R 13/5202* (2013.01); *H01R 13/74* (2013.01)

(58) Field of Classification Search
CPC .......................... H01R 23/7073; H01R 9/7075
USPC ....................... 439/79, 67, 493, 498, 77, 271
See application file for complete search history.

(56) References Cited

U.S. PATENT DOCUMENTS

| | | | | |
|---|---|---|---|---|
| 5,167,511 | A | * | 12/1992 | Krajewski ................ H01R 4/01 361/785 |
| 5,194,010 | A | * | 3/1993 | Dambach ............... H01R 12/57 439/499 |
| 5,466,162 | A | | 11/1995 | Schroepfer |
| 8,884,155 | B2 | | 11/2014 | Luch |
| 9,888,571 | B2 | * | 2/2018 | Verhoeve ................. H05K 1/09 |

(Continued)

*Primary Examiner* — Phuong Chi Thi Nguyen
(74) *Attorney, Agent, or Firm* — Kilpatrick Townsend & Stockton, LLP

(57) ABSTRACT

Connector receptacles that may be space efficient and provide a direct connection to a flexible circuit board. One example may provide an electronic device having a receptacle including a recess formed in a housing of the electronic device. The recess may have a sidewall and a bottom surface portion, and the bottom surface portion may include one or more openings extending through the bottom surface portion from an external surface to an internal surface. One or more contacts formed on a flexible circuit board may be aligned with the one or more openings in the bottom surface portion. In this way, the receptacle may be space efficient and provide a direct connection to a flexible circuit board inside an electronic device. A cosmetic cap may be placed in the recess to obscure the existence of the connector receptacle.

20 Claims, 7 Drawing Sheets

(56) References Cited

U.S. PATENT DOCUMENTS

| | | |
|---|---|---|
| 10,051,732 B2 * | 8/2018 | Verhoeve ................. H05K 1/09 |
| 2002/0162260 A1 | 11/2002 | Tate |
| 2013/0312809 A1 | 11/2013 | Luch |
| 2016/0064840 A1 | 3/2016 | Verhoeve |
| 2017/0250578 A1 * | 8/2017 | Kallman ................. H02J 50/90 |

* cited by examiner

RECEPTACLE FOR CONNECTING TO FLEXIBLE CIRCUIT BOARD

CROSS-REFERENCES TO RELATED APPLICATIONS

This application is a continuation of U.S. patent application Ser. No. 15/888,545, filed Feb. 5, 2018, which is a continuation of U.S. patent application Ser. No. 14/641,316, filed Mar. 7, 2015, which claims the benefit of U.S. provisional patent application No. 62/044,869, filed Sep. 2, 2014, which are incorporated by reference.

BACKGROUND

Electronic devices often include one or more connector receptacles though which they may provide and receive power and data. This power and data may be conveyed over cables that may include wire conductors, fiber optic cables, or some combination of these or other conductors. Cable assemblies may include a connector insert at each end of a cable. The connector inserts may be inserted into receptacles in the communicating electronic devices.

These receptacles may be a relatively large electrical component having a housing, shielding, contacts, and other structures. These receptacles may have an opening aligned with an opening in an electronic device. These receptacles may be mounted on a printed circuit board such as a main logic or motherboard.

Accordingly, conventional connector receptacles may be a component that is manufactured as a separate device, then placed on a printed circuit board and aligned with an opening in an electronic device. Electrical paths for power and data may be formed by conductors in a cable, pins in a connector insert at an end of the cable, pins in a connector receptacle, and traces on a printed circuit board.

But these connector receptacles may be relatively large. This may be undesirable since electronic devices are becoming ever smaller over time. Using a large receptacle may limit how small a device may be made, it may limit the functionality that may be included in the device, or it may limit both how small a device may be made and the functionality that may be included in the device.

Moreover, many smaller devices may not include a printed circuit board due to size constraints. These devices may instead include conductive pathways formed of flexible circuit boards or similar structures.

Thus, what is needed are connector receptacles that may be space efficient and provide direct connection to flexible circuit boards.

SUMMARY

Accordingly, embodiments of the present invention may provide connector receptacles that may be space efficient and provide direct connections to flexible circuit boards. An illustrative embodiment of the present invention may provide an electronic device having a receptacle formed in a housing of the electronic device. The receptacle may include a recess in the housing. The recess may include a sidewall and a bottom surface portion. The bottom surface portion may include one or more openings extending through the bottom surface portion from an external surface to an internal surface. One or more contacts may be aligned with the one or more openings in the bottom surface portion. For example, the receptacle may include a plurality of contacts each aligned with one of the openings in the bottom surface portion. In various embodiments of the present invention, the contacts may be formed on a flexible circuit board. In this way, the receptacle may be space efficient and provide a direct connection to a flexible circuit board inside an electronic device.

Embodiments of the present invention may provide for a high level of resistance to water leakage. One embodiment of the present invention may include a seal located between an internal surface of the bottom surface portion and the flexible circuit board. This seal may be an insulative layer. This seal may be a flexible layer or gasket and may be formed of silicone or other material. This seal may also be formed of an O-ring or similar structure. The seal may have one or more openings to allow access through the bottom surface portion to the one or more contacts. The seal formed using this flexible layer may be a dust seal, light seal, particle seal, air seal, water seal, or other type of seal or combination thereof.

Various embodiments of the present invention may provide mechanical support for the flexible circuit board in various ways. In one embodiment of the present invention, a bracket may be used to secure a flexible circuit board in place such that contacts on the flexible circuit board remain aligned with the one or more openings in the bottom surface portion. The bracket may be fixed to the bottom surface portion, another portion or portions of the housing, or other structure attached or associated with the housing. The bracket may be fixed in place using one or more fasteners or other components. For example, one or more screws may pass through openings in the bracket into holes in an internal surface of the bottom surface portion of the housing. One or more alignment pins may be formed on the bracket and may fit in corresponding holes in the internal surface of the bottom surface portion of the housing, another portion or portions of the housing, or other structure attached or associated with the housing. The bracket may be attached to the flexible circuit board with a layer of adhesive, such as a pressure sensitive adhesive (PSA), double sided tape, or other adhesive.

Contacts may be formed on flexible circuit boards in various ways. In one embodiment of the present invention a flexible circuit board may include a flexible material supporting a first conductive layer. A portion of the first conductive layer may be exposed and not covered by the flexible supporting material. A second conductive layer may be over and attached to the first conductive layer. A plating layer may be over the second conductive layer. A coverlay may be formed over a portion of the flexible supporting material and around the first portion of the first conductive layer. The coverlay may be covered by an adhesive layer. A liquid photoimagable layer may be formed over the adhesive layer. The first conducive layer and the second conductive layer may be attached using a solder layer. The first conductive layer may copper, the second conductive layer may be stainless steel, and the plating layer may be gold. Additional plating layers of nickel or other material may be used as well.

In various embodiments of the present invention, these receptacles may be used often and may therefore remain accessible to a user. In other embodiments, these receptacles may be used less frequently. For example, they may be used during software or firmware updates and not used at other times. In these embodiments, a semi-permanent or removable cosmetic caps or cover seal may be placed over the receptacle opening to reduce water leakage and to otherwise protect the flexible circuit board contacts. In still other embodiments of the present invention, this connector receptacle may be accessible during manufacturing, for example, only during initial testing or programming. In these various embodiments of the present invention, a cosmetic cap or cover seal may be placed in the connector receptacle recess. The cosmetic cap or cover seal may have a surface that is flush with a portion of the device enclosure around the connector receptacle. The cosmetic cap or cover seal may be formed of the same material as the device enclosure, or it may be formed of another material. A layer of adhesive may be used to fix the cosmetic cap or cover seal in place after testing and programming is complete. As with the other adhesives discussed herein, this layer may be a layer of pressure sensitive adhesive, double sided tape, or other adhesive. The cover seal may, as with the flexible layer or piece, form a water seal, a dust seal, light seal, particle seal, air seal, or other type of seal or combination thereof.

The connector receptacles employed by embodiments of the present invention may be formed in various ways of various materials. For example, a receptacle may include a flexible circuit board. The flexible circuit board may include various layers having traces or planes on them, where the various traces and planes are connected using vias between layers. The flexible circuit board may be formed as part of a larger flexible circuit board that may form a logic or motherboard in an electronic device. In other embodiments of the present invention, these flexible circuit boards may be formed of conductive or metallic traces and planes in or on a nonconductive body. The nonconductive body may be formed of plastic or other materials.

In various embodiments of the present invention, enclosures (in some cases), contacts, brackets, power and ground planes, traces, fasteners, and other conductive portions of connector receptacles may be formed by stamping, metal-injection molding, machining, micro-machining, 3-D printing, or other manufacturing process. The conductive portions may be formed of stainless steel, steel, copper, copper titanium, phosphor bronze, or other material or combination of materials. They may be plated or coated with nickel, gold, or other material. The nonconductive portions, such as the enclosures (again, in some cases), silicone gaskets, fasteners and other portions, may be formed using injection or other molding, 3-D printing, machining, or other manufacturing process. The nonconductive portions may be formed of silicon or silicone, rubber, hard rubber, plastic, nylon, liquid-crystal polymers (LCPs), ceramics, or other nonconductive material or combination of materials. Flexible circuit boards may be replaced by other substrates, such as printed circuit boards, in many embodiments of the present invention.

Embodiments of the present invention may provide connector receptacles that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These connector receptacles may provide pathways for signals that are compliant with various standards such as Universal Serial Bus (USB), High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In various embodiments of the present invention, these interconnect paths provided by these connector receptacles may be used to convey power, ground, signals, test points, and other voltage, current, data, or other information.

Various embodiments of the present invention may incorporate one or more of these and the other features described herein. A better understanding of the nature and advantages of the present invention may be gained by reference to the following detailed description and the accompanying drawings.

DESCRIPTION OF EXEMPLARY
EMBODIMENTS

Figure 1:
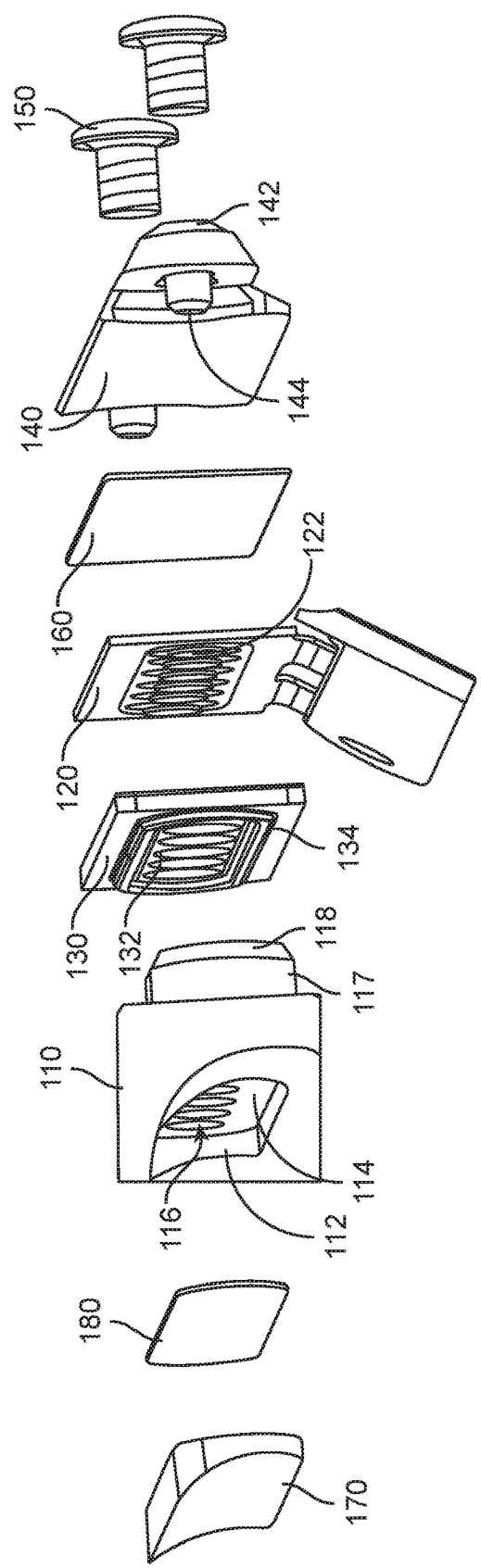
FIG. 1 illustrates an exploded view of a connector receptacle according to embodiment of the present invention.

FIG. 1 illustrates an exploded view of a connector receptacle according to embodiment of the present invention. This figure, as with the other included figures, is shown for illustrative purposes and does not limit either the possible embodiments of the present invention or the claims.

In this figure, a connector receptacle may be formed in device enclosure 110. The receptacle may include a sidewall 112 terminating in an external surface 114 of bottom surface portion 117. Bottom surface portion 117 may include the external surface 114 and an internal surface 118. Bottom surface portion 117 may further include openings 116.

Openings 116 may provide access to contacts 122. Specifically, bottom surface portion 117 may include one or more openings 116 that extend from an external surface 114 to an internal surface 118 of bottom surface portion 117. The one or more openings 116 may provide access to one or more contacts 122. In a specific embodiment of the present invention, openings 116 may include one opening to provide access for one or more contacts 122. In another embodiment of the present invention, bottom surface portion 117 may include a number of openings 116 each providing access for a corresponding contact 122. Contacts 122 may be formed on printed circuit board 120.

In various embodiments of the present invention, it may be desirable to prevent or reduce water leakage through the one or more openings 116 into the electronic device enclosed by enclosure 110. In these situations, a gasket, O-ring, or similar structure may be used to form a seal. This seal may be a water seal, a dust seal, light seal, particle seal, air seal, or other type of seal or combination thereof. For example, an insulative or flexible piece (or silicon gasket) 130 may be included. Flexible piece 130 may be a silicone gasket 130. In an embodiment of the present invention, silicone gasket 130 may include a number of openings 132. In various embodiments of the present invention, silicone gasket 130 may include one opening to provide access to all of the contacts 122. In other embodiments of the present invention, silicone gasket 130 may include a number of openings 132, each opening corresponding to, and providing access to, one of the contacts 122 on the flexible circuit board 120. Silicone gasket 130 may include a raised portion or edge 134 to form a seal around an edge of bottom surface portion 117. In other embodiments of the present invention, an O-ring or other structure may be used in place of, or in conjunction with, silicone gasket 130.

In various embodiments of the present invention, contacts 122 may be held in alignment with openings 116 in device enclosure 110 in various ways. For example, brackets, pins, fasteners, or other structures may be used. In this example, bracket 140 may be used to secure printed circuit board 120 in place relative to openings 116. Specifically, bracket 140 may include alignment pins 144 that may mate with corresponding holes (not shown) in internal surface 118 of bottom surface portion 117. When alignment pins 144 are inserted, fasteners 150 may be passed through openings 142 in bracket 140. These screws or fasteners 150 may screw into threaded holes (not shown) in an internal surface 118 of bottom surface portion 117. Adhesive 160 may be used to fasten flexible circuit board 120 to bracket 140 in order to hold bracket 140 in place during assembly. As with the other adhesives shown herein, layer 160 may be a layer of adhesive, such as a pressure sensitive adhesive, double sided tape, or other adhesive.

Again, in various embodiments of the present invention, these receptacles may be used often and may therefore remain accessible to user. In other embodiments of the present invention, these receptacles may be used less frequently. For example, they may be used during software or firmware updates and not used for other data updates or charging. In these embodiments of the present invention, a semi-permanent or removable cover or seal may be placed over receptacle opening. This cover may reduce water leakage and otherwise protect the flexible circuit board contacts. In still other embodiments the present invention, this connector receptacle may be accessible only by the manufacturer. In these embodiments, the connector receptacle may be useful during testing, initial programming, or other such activities. In this case, a cosmetic cap or cover seal 170 may be fixed more permanently in the connector receptacle recess. These semi-permanent or more permanent cosmetic caps or cover seals 170 may have surfaces that are flush with a portion of the device enclosure around the connector receptacle. The cosmetic caps or seals 170 may be formed of the same material as the device enclosure 110 or they may be formed of a different material. A layer 180 of adhesive may be used to fix the cosmetic cap or cover seal 170 in place after manufacturing. As before, layer 180 may be a layer of adhesive such as a pressure sensitive adhesive, double sided tape, or other type of adhesive layer. In this example, cover seal 170 may be held in place by adhesive layer 180 in the receptacle recess in enclosure 110. An outside surface of the cover seal 170 may be shaped to fit an outer lip of sidewall 112. Cover seal 170 may, as with flexible layer or silicon gasket 130, form a water seal, a dust seal, light seal, particle seal, air seal, or other type of seal or combination thereof.

Again, in various embodiments of the present invention, contacts 122 may remain accessible, or they may be covered either semi-permanently or (more) permanently with a cover or cap. Examples are shown in the following figure.

Figure 2:
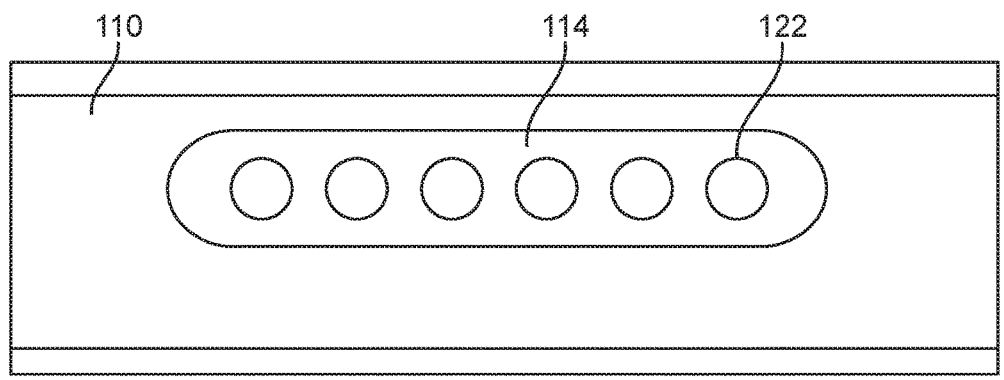
FIG. 2 illustrates front views of connector receptacles according to embodiments of the present invention.
Figure 2:
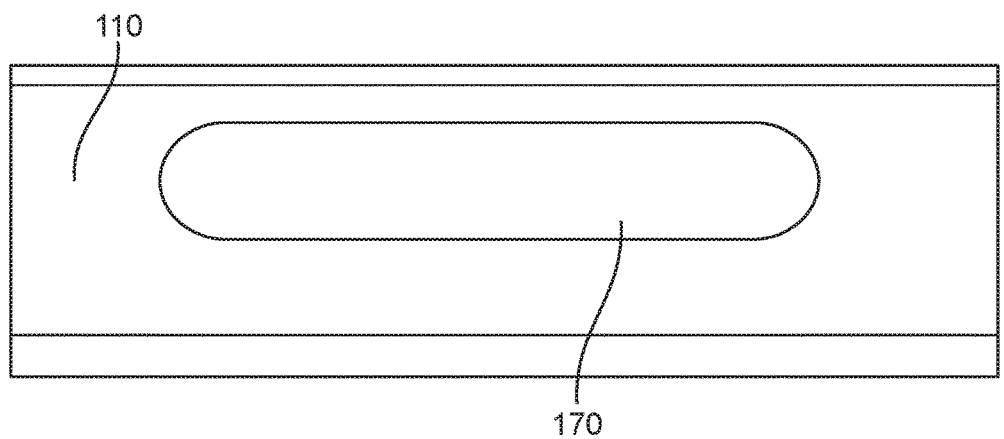

FIG. 2 illustrates front views of connector receptacles according to embodiments of the present invention. The top receptacle formed in enclosure 110 has a recess having an external surface 114. Openings in external surface 114 allow access to contacts 122. The bottom receptacle formed in enclosure 110 has a recess that has been filled with a cosmetic cap or cover seal 170.

Figure 3:
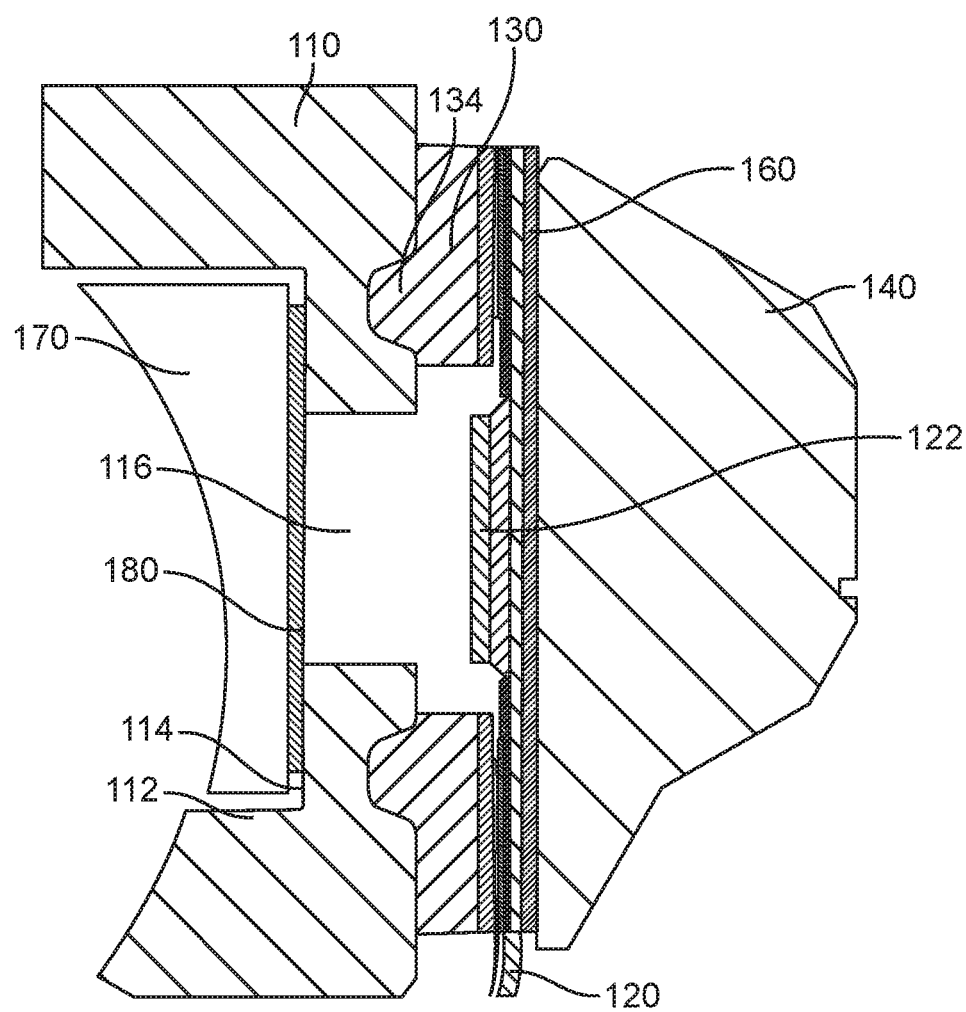
FIG. 3 illustrates a side view of an assembled connector receptacle according to an embodiment of the present invention.

FIG. 3 illustrates a side view of an assembled connector receptacle according to an embodiment of the present invention. Again, device enclosure 110 may include a connector receptacle recess formed by sidewalls 112 terminating in external surface 114. The external surface 114 may include openings 116 to provide access to contacts 122. Contacts 122 may be located on flexible circuit board 120. Flexible circuit board 120 may be fixed to bracket 140 with adhesive layer 160. A cosmetic cap or cover seal 170 may be attached to bottom surface portion or external surface 114 by adhesive layer 180. Cosmetic cap or cover seal 170 may help to prevent water (or other substance) ingress and may protect contacts 122 from exposure. Silicone gasket or O-ring 130 may be used to form a seal between enclosure 110 and flexible circuit board 120. Silicone gasket 130 may further protect the enclosed device from water (or other substance) leakage.

Figure 4:
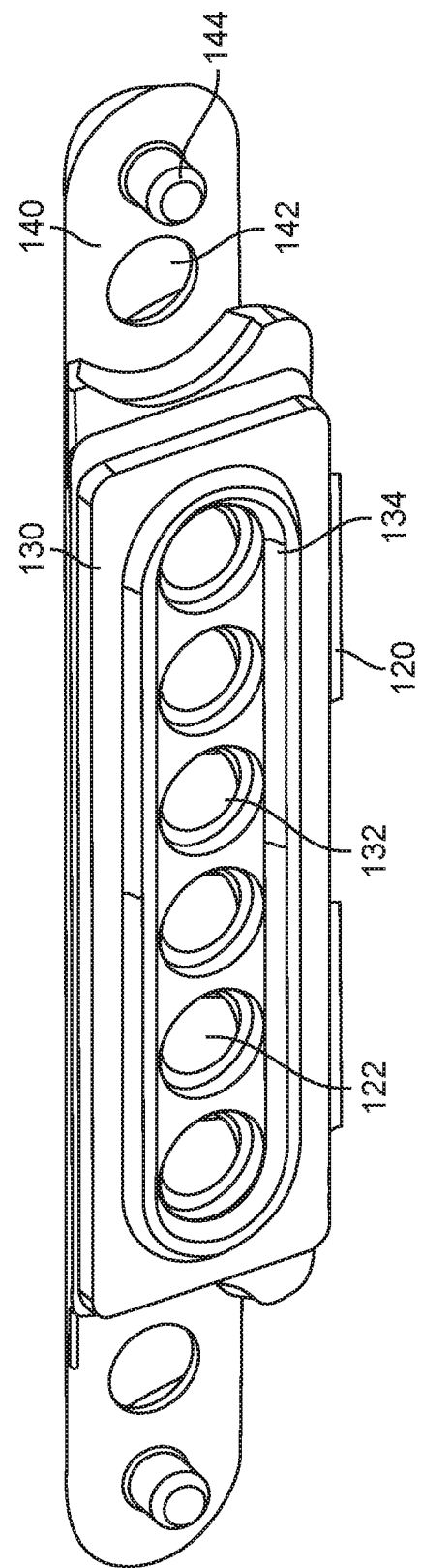
FIG. 4 illustrates a portion of a connector receptacle according to an embodiment of the present invention.

FIG. 4 illustrates a portion of a connector receptacle according to an embodiment of the present invention. Again, silicone gasket 130 may include a number of openings 132 to provide access to contacts 122. Contacts 122 may be formed on flexible circuit board 120. Silicone gasket 130 may further include a raised edge 134 to engage an edge or lip on an internal surface 118 of bottom surface portion 117. Bracket 140 may be used to fix flexible circuit board 120 in place. Specifically, bracket 140 may include alignment pins 144 that may fit in holes in an internal surface 118 of bottom surface portion 117. Fasteners 150 may be inserted through openings 142 and into threaded holes in an internal surface 118 in bottom surface portion 117. In other embodiments of the present invention, either or both alignment pins 144 and fasteners 150 may engage other parts of device enclosure 110, or other structures associated with or attached to device enclosure 110.

Figure 5:
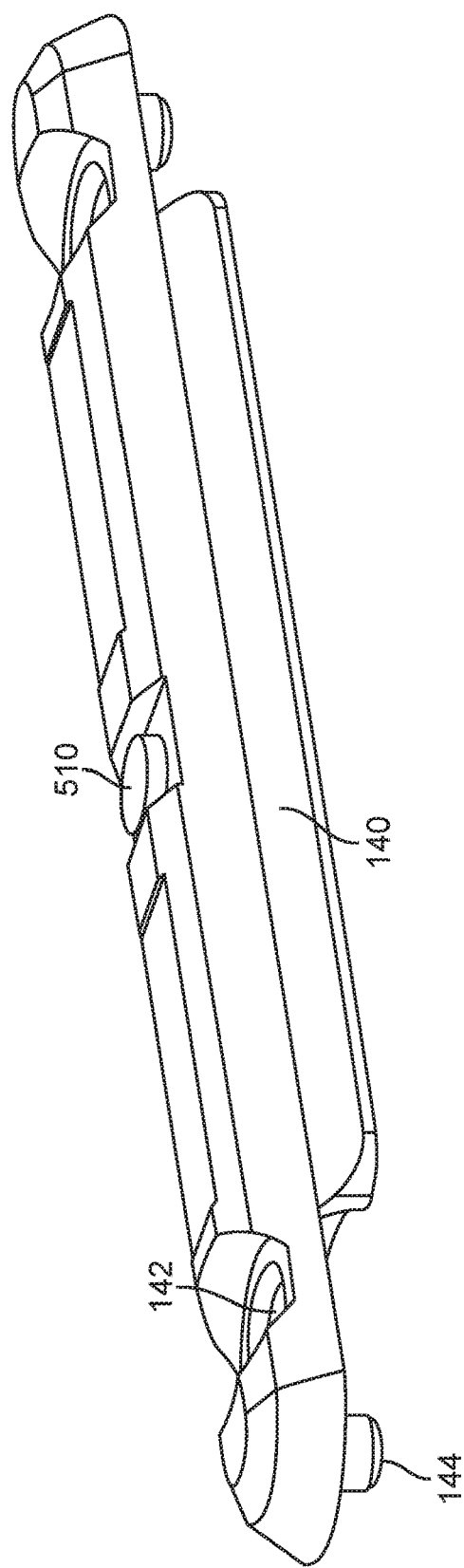
FIG. 5 illustrates an oblique view of a bracket for a connector receptacle according to an embodiment of the present invention.

FIG. 5 illustrates an oblique view of a bracket for a connector receptacle according to an embodiment of the present invention. Bracket 140 may include through holes or openings 142 and alignment pins 144. Again, through holes or openings 142 may accept fasteners 150 and alignment pins 144 may fit in openings in an internal surface 118 of bottom surface portion 117. Bracket 140 may further include pin 510. Pin 510 may be used during the assembly process to secure bracket 140 in place while fasteners 150 are inserted.

Contacts 122 may be formed in various ways in various embodiments of the present invention. An example is shown in the following figures.

Figure 6:
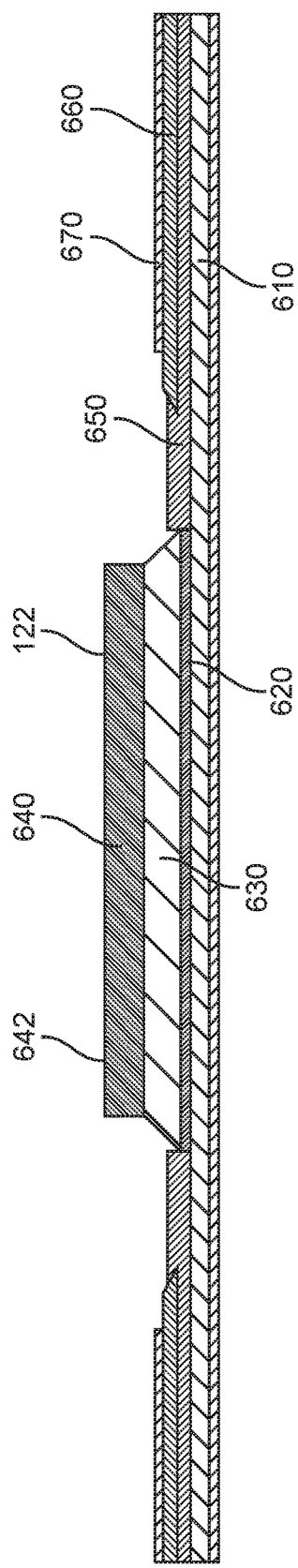
FIG. 6 illustrates a side view of a contact on a flexible circuit board according to an embodiment of the present invention.

FIG. 6 illustrates a side view of a contact on a flexible circuit board according to an embodiment of the present invention. In this example, one or more conductive layers 620 may be formed in or on flexible layer 610. A portion of a first conductive layer 620 may be exposed and accessible. That is, a portion of a first conductive layer 620 is not covered by flexible circuit board material in this example. A second conductive layer 640 may be placed over and attached to the first portion of the first conductive layer 620. The first conductive layer 620 and second conductive layer 640 may be attached by solder 630. These second conductive layer 640 may be plated with gold layer 642.

The flexible circuit board 610 may be covered with a coverlay 650. Coverlay 650 may be all or partially covered with adhesive layer 660. A liquid photoimagable layer 670 may be formed over adhesive 660.

A side view of a contact 122 is shown in the following figure.

Figure 7:
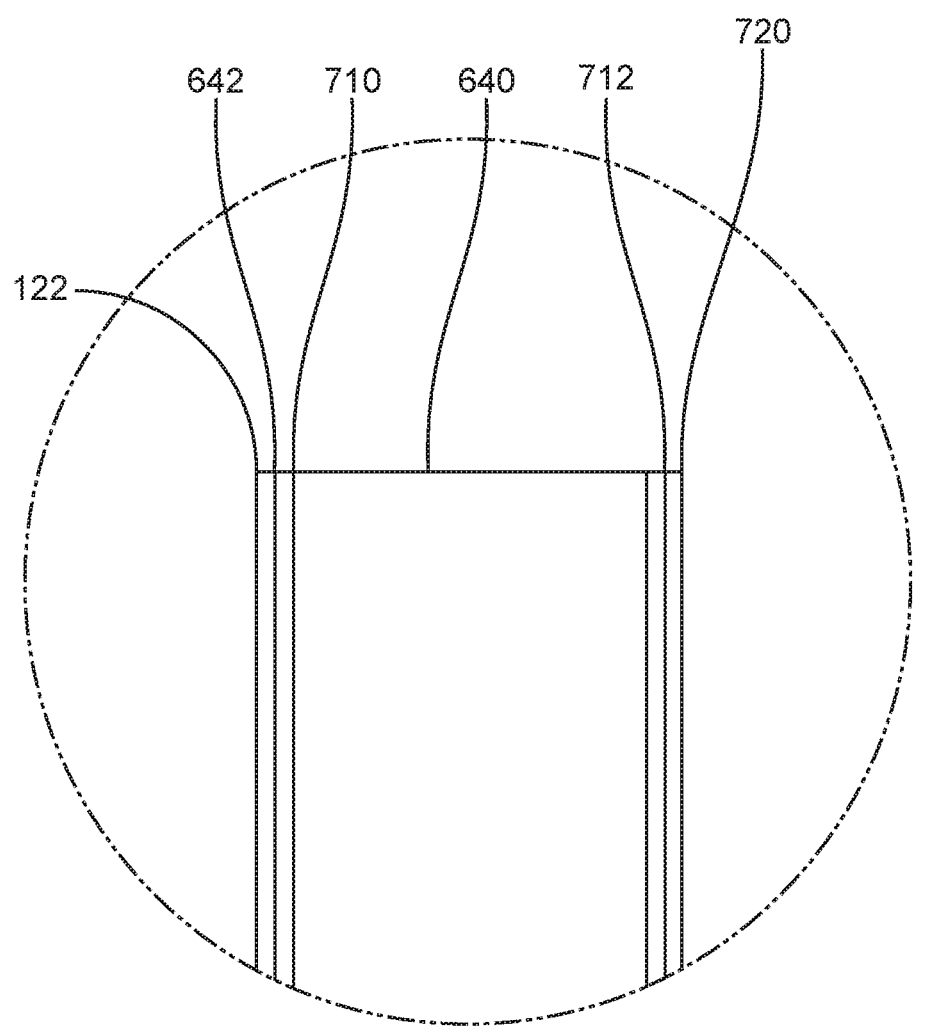
FIG. 7 illustrates a side cutaway view of a contact according to an embodiment of the present invention.

FIG. 7 illustrates a side cutaway view of a contact according to an embodiment of the present invention. In this example, the contact may be formed primarily of stainless steel layer 640. Nickel layer 712 may be plated on a surface of the stainless steel layer 640. Nickel layer 712 may be tinned with solder layer 720 to form a connection to a conductive layer in or on a flexible circuit board. A second nickel layer 710 may be placed on the far side of stainless steel layer 640. Nickel layer 710 may be gold plated with gold layer 642 to form a surface of contact 122.

Again, embodiments of the present invention may provide connector receptacles that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These connector receptacles may provide pathways for signals that are compliant with various standards such as Universal Serial Bus (USB), High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In various embodiments of the present invention, these interconnect paths provided by these connector receptacles may be used to convey power, ground, signals, test points, and other voltage, current, data, or other information.

In a specific embodiment of the present invention, a connector receptacle may provide contacts for more than one type of interface. For example, contacts for one or more data interfaces, such as a UART, USB, DVI, Ethernet, or other type of data interfaces may be included. Also, contacts for one or more testing interfaces, such as JTAG, DART, or TAP testing interfaces may be included.

Contacts for power, clock, ground, connect detect, and other types of contacts may also be included. In one embodiment, power provided by an internal battery may be measured at a power pin. Disconnect diodes or other techniques may be used to allow a higher voltage to be provided at the pin. When a higher voltage is provided, the internal circuitry may enter a testing, programming, or other mode.

Again, connector receptacles employed by embodiments of the present invention may be formed in various ways of various materials. For example, a receptacle may include a flexible circuit board. The flexible circuit board may include various layers having traces or planes on them, where the various traces and planes are connected using vias between layers. The flexible circuit board may be formed as part of a larger flexible circuit board that may form a logic or motherboard in an electronic device. In other embodiments of the present invention, these flexible circuit boards may be formed of conductive or metallic traces and planes in or on a nonconductive body. The nonconductive body may be formed of plastic or other materials.

Again, in various embodiments of the present invention, enclosures (in some cases), contacts, brackets, power and ground planes, traces, fasteners, and other conductive portions of connector receptacles may be formed by stamping, metal-injection molding, machining, micro-machining, 3-D printing, or other manufacturing process. The conductive portions may be formed of stainless steel, steel, copper, copper titanium, phosphor bronze, or other material or combination of materials. They may be plated or coated with nickel, gold, or other material. The nonconductive portions, such as the enclosures (again, in some cases), silicone gaskets, fasteners and other portions, may be formed using injection or other molding, 3-D printing, machining, or other manufacturing process. The nonconductive portions may be formed of silicon or silicone, rubber, hard rubber, plastic, nylon, liquid-crystal polymers (LCPs), ceramics, or other nonconductive material or combination of materials. Flexible circuit boards may be replaced by other substrates, such as printed circuit boards, in many embodiments of the present invention.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
a device enclosure;
a connector receptacle located in an opening in the device enclosure and comprising:
a recess defined by a sidewall, the sidewall around an opening in a bottom of the recess, the sidewall between the opening in the device enclosure and the bottom of the recess;
a board; and
a plurality of contacts supported by the board, each contact having a contacting surface to form an electrical connection, wherein each of the contacting surfaces is accessible through the opening in the bottom of the recess;
a cover located in the opening in the device enclosure; and
a gasket between the opening in the device enclosure and the plurality of contacts.

2. The electronic device of claim 1 wherein the gasket forms a seal to protect the connector receptacle.

3. The electronic device of claim 1 wherein the cover is curved and is flush with a surface of the device enclosure.

4. The electronic device of claim 1 wherein the cover is formed of the same material as the device enclosure.

5. The electronic device of claim 1 wherein the board is a flexible circuit board.

6. The electronic device of claim 5 wherein the flexible circuit board is on a surface of a printed circuit board.

7. The electronic device of claim 5 wherein the flexible circuit board is on a housing, the housing supporting the plurality of contacts.

8. An electronic device comprising:
a connector receptacle located in an opening of the electronic device and comprising:
   a housing forming a recess having a sidewall, the sidewall extending into the electronic device, the recess having a bottom opening;
   a plurality of contacts, each contact having a contacting surface exposed at the bottom opening of the recess; and
   a flexible circuit board in the bottom opening of the recess, the flexible circuit board supporting the plurality of contacts; and
a cover located in the opening of the electronic device.

9. The electronic device of claim 8 further comprising a gasket adjacent to the housing to seal the connector receptacle.

10. The electronic device of claim 8 further comprising a printed circuit board supporting the plurality of contacts and the flexible circuit board.

11. The electronic device of claim 8 further comprising a bracket supporting the plurality of contacts and the flexible circuit board.

12. The electronic device of claim 8 further comprising a bracket, the bracket securing the flexible circuit board in the bottom opening of the recess.

13. The electronic device of claim 12 wherein the cover is attached to the housing using a first adhesive layer.

14. The electronic device of claim 13 wherein the first adhesive layer is double-sided tape.

15. An electronic device comprising:
a device enclosure, the device enclosure having an opening;
a connector receptacle located in the opening in the device enclosure and comprising:
   a sidewall extending from the opening in the device enclosure and forming a bottom opening;
   a plurality of contacts, each having a contacting surface accessible in the bottom opening; and
   a flexible circuit board supporting the plurality of contacts; and
a gasket forming a seal to prevent moisture ingress into the electronic device through the connector receptacle.

16. The electronic device of claim 15 wherein the contacting surface of each contact connects to a corresponding contact in a corresponding connector when the corresponding connector is mated to the connector receptacle, wherein each of the contacting surfaces are between the flexible circuit board and the opening in the device enclosure.

17. The electronic device of claim 15 further comprising a board supporting the plurality of contacts, and a bracket, such that the board is between the bracket and the opening in the device enclosure.

18. The electronic device of claim 15 wherein the sidewall terminates in a bottom surface, the bottom surface having the bottom opening.

19. The electronic device of claim 18 further comprising a cover positioned such that the gasket is between the cover and the plurality of contacts.

20. The electronic device of claim 19 wherein the cover is curved and is flush with a surface of the device enclosure.

* * * * *